(12) United States Patent
Yajima et al.

(10) Patent No.: US 7,530,462 B2
(45) Date of Patent: May 12, 2009

(54) WAFER STORAGE CONTAINER

(75) Inventors: Toshitsugu Yajima, Saitama (JP); Toshiyuki Kamada, Saitama (JP)

(73) Assignee: Shin-Etsu Polymer Co., Ltd, Tokyo (JP)

(*) Notice: Subject to any disclaimer, the term of this patent is extended or adjusted under 35 U.S.C. 154(b) by 55 days.

(21) Appl. No.: 11/756,991

(22) Filed: Jun. 1, 2007

(65) Prior Publication Data
US 2007/0284282 A1    Dec. 13, 2007

(30) Foreign Application Priority Data
Jun. 7, 2006    (JP)    ............... 2006-158372

(51) Int. Cl.
*B65D 85/30*    (2006.01)
(52) U.S. Cl. .............. 206/710; 206/303; 206/454; 206/509; 211/41.18
(58) Field of Classification Search .......... 206/303, 206/454–456, 449, 710, 711, 712, 503, 509, 206/511, 832; 211/41.18, 41.1, 41.14
See application file for complete search history.

(56) References Cited
U.S. PATENT DOCUMENTS
6,550,619 B2 * 4/2003 Bores et al. ............ 206/710
6,729,474 B2 * 5/2004 Hong et al. ............ 206/714
6,915,906 B2 * 7/2005 Pylant et al. ............ 206/710
2005/0061700 A1 * 3/2005 Windus-Smith et al. ..... 206/438

FOREIGN PATENT DOCUMENTS
JP    2000-077512    3/2000

* cited by examiner

*Primary Examiner*—Luan K Bui
(74) *Attorney, Agent, or Firm*—Mark Montague; Cowan, Liebowitz & Latman, P.C.

(57) ABSTRACT

A wafer storage container includes an outer peripheral portion located outside an outer peripheral edge of a wafer, and a placing portion which extends from a position lower than an uppermost surface of the outer peripheral portion to a radial inside of the wafer and on which the wafer is placed at a position lower than the uppermost surface of the outer peripheral portion. The placing portion includes a first inclined surface which descends toward the radial inside of the wafer and can be brought into contact with only the outer peripheral edge of the wafer when the wafer is placed and a second inclined surface which is on a rear side of the first inclined surface, ascends toward the radial inside of the wafer, and can be brought into contact with only the outer peripheral edge of a lower wafer when a plurality of wafer storage containers are stacked.

9 Claims, 9 Drawing Sheets

WAFER STORAGE CONTAINER

CLAIM OF PRIORITY

This application claims the benefit of Japanese Patent Application No. 2006-158372, filed Jun. 7, 2006, the disclosure of which is hereby incorporated by reference herein.

BACKGROUND OF THE INVENTION

1. Field of the Invention

The present invention relates to a wafer storage container to store, carry, or keep a wafer.

2. Description of the Related Art

As a conventional wafer storage container, a wafer storage container obtained by stacking a plurality of wafer containers in each of which a wafer is stored in a recessed-shaped storage recessed portion corresponding to a diameter of a wafer has been known (see Japanese Patent Application Laid-Open No. 2000-77512 (FIGS. 2 to 6)).

However, in the wafer storage container disclosed in the Japanese Patent Application Laid-Open No. 2000-77512, a wafer is simply placed on a storage recessed portion. For this reason, the wafer and the wafer storage container are in area contact with each other. In this manner, when a wafer is in area contact with the wafer storage container, the wafer is disadvantageously scratched. Furthermore, in the wafer storage container disclosed in the Japanese Patent Application Laid-Open No. 2000-77512, a method of arranging a cushion sheet between the wafer and the storage recessed portion is also proposed in order to prevent a wafer from being scratched. However, when the configuration is employed, the numbers of parts and operation steps disadvantageously increase.

SUMMARY OF THE INVENTION

The present invention has been made in consideration of the problem, and has as its object to provide a wafer storage container which can easily store a wafer without increasing the number of parts and without scratching the wafer.

In order to solve the above problem, according to the present invention, there is provided a wafer storage container including an outer peripheral portion located outside an outer peripheral edge of a wafer, and a placing portion which extends from a position lower than an uppermost surface of the outer peripheral portion to a radial inside of the wafer and on which the wafer is placed at a position lower than the uppermost surface of the outer peripheral portion, wherein the placing portion includes a first inclined surface which descends toward the radial inside of the wafer and can be brought into contact with only the outer peripheral edge of the wafer when the wafer is placed and a second inclined surface which is on a rear side of the first inclined surface, ascends toward the radial inside of the wafer, and can be brought into contact with only the outer peripheral edge of a lower wafer when a plurality of wafer storage containers are stacked.

In the above configuration, when a wafer is placed on the placing portion, only the outer peripheral edge of the wafer is brought into contact with the first inclined surface. More specifically, the outer peripheral edge of the wafer is brought into line contact with the first inclined surface. Therefore, the rear surface of the wafer is not in area contact with the placing portion, and a gap is formed between the rear surface of the wafer and the placing portion. As a result, the rear surface of the wafer can be prevented from being scratched. When the wafer storage containers in which wafers are stored are vertically stacked, a wafer is brought into contact with a second inclined surface of a wafer storage container stacked on the upper side of the corresponding wafer on its outer peripheral edge. For this reason, the surface of the wafer is also in line contact with the placing portion of the wafer storage container stacked on the wafer. Therefore, the surface of the wafer is not in area contact with the placing portion, and a gap is formed between the surface of the wafer and the placing portion. As a result, the surface of the wafer can be prevented from being scratched.

In another aspect of the invention, in addition to the above aspect, an outer peripheral portion includes a plurality of projecting portions projecting upward and arranged on an upper surface of the outer peripheral portion at predetermined intervals, and a first inclined surface is connected to a wafer from both the projecting portions and a recessed portion between the projecting portions to make it possible to horizontally hold the wafer at the same level when the wafer is placed.

In the configuration, when the wafer storage containers in which wafers are stored are vertically stacked, the projecting portions and the recessed portions of the stacked wafer storage containers overlap, respectively. Therefore, when the wafer storage containers are stacked, the wafer storage containers can be prevented from being misaligned or unstabled. Since the wafer is horizontally held at the same level by the first inclined surface, even though the wafer storage containers are stacked, wafers can be stably stored in the wafer storage containers. By such an easily operation that wafer storage containers in which wafers are stored are sequentially stacked, a plurality of wafer can be stored.

Furthermore, according to still another aspect of the invention, in addition to the above aspect of the invention, a wafer storage container has a ring-like shape having a through hole. In this configuration, when a wafer stored in the wafer storage container bends by its weight, the wafer can be prevented from being in contact with a placing portion. Furthermore, the wafer storage container can be reduced by a weight corresponding to the volume of the through hole.

According to still another aspect of the invention, in addition to the above aspect of the invention, a placing portion has a plurality of notch grooves obtained by notching the placing portion along a circumferential direction. In the configuration, a wafer can be removed from a wafer storage container by using a jig having projections inserted into the notch grooves. More specifically, the projections of the jig are inserted into the notch grooves formed in the wafer storage container, only a wafer is placed on the projections, and the wafer storage container is dropped down the jig through the notch grooves, so that the wafer can be extracted from the wafer storage container.

According to still another aspect of the present invention, in addition to the above aspect of the invention, a mark to indicate an orientation of a wafer is provided on a wafer storage container. In this configuration, the wafer can be stored in the wafer storage container with a constant orientation.

Therefore, when the wafer is extracted from the wafer storage container, the wafer can be easily extracted with an orientation. For this reason, operation efficiency can be improved.

According to the present invention, a wafer can be easily stored without increasing the number of parts and without being scratched. An arbitrary number of wafer storage containers can be stacked, and a storage space can be advantageously saved.

Various other objects, advantages and features of the present invention are described below.

BRIEF DESCRIPTION OF THE DRAWINGS

The following detailed description, given by way of example and not intended to limit the present invention solely thereto, will best be appreciated in conjunction with the accompanying drawings, wherein like reference numerals denote like elements and parts, in which:

FIGS. 7A and 7B are enlarged views of parts of the sectional view in FIG. 6, in which

FIGS. 8A and 8B are views for explaining a state of wafers in a state in which wafer storage containers in which wafers are stored are stacked, in which

FIGS. 9A and 9B are perspective views showing a configuration of the wafer storage container according to the embodiment of the present invention, in which FIGS. 10A to 10C are views for explaining a method of extracting a wafer from a wafer storage container, in which

DETAILED DESCRIPTION OF THE PREFERRED EMBODIMENTS

A wafer storage container 10 according to an embodiment of the present invention will be described below with reference to the accompanying drawings.

Figure 1:
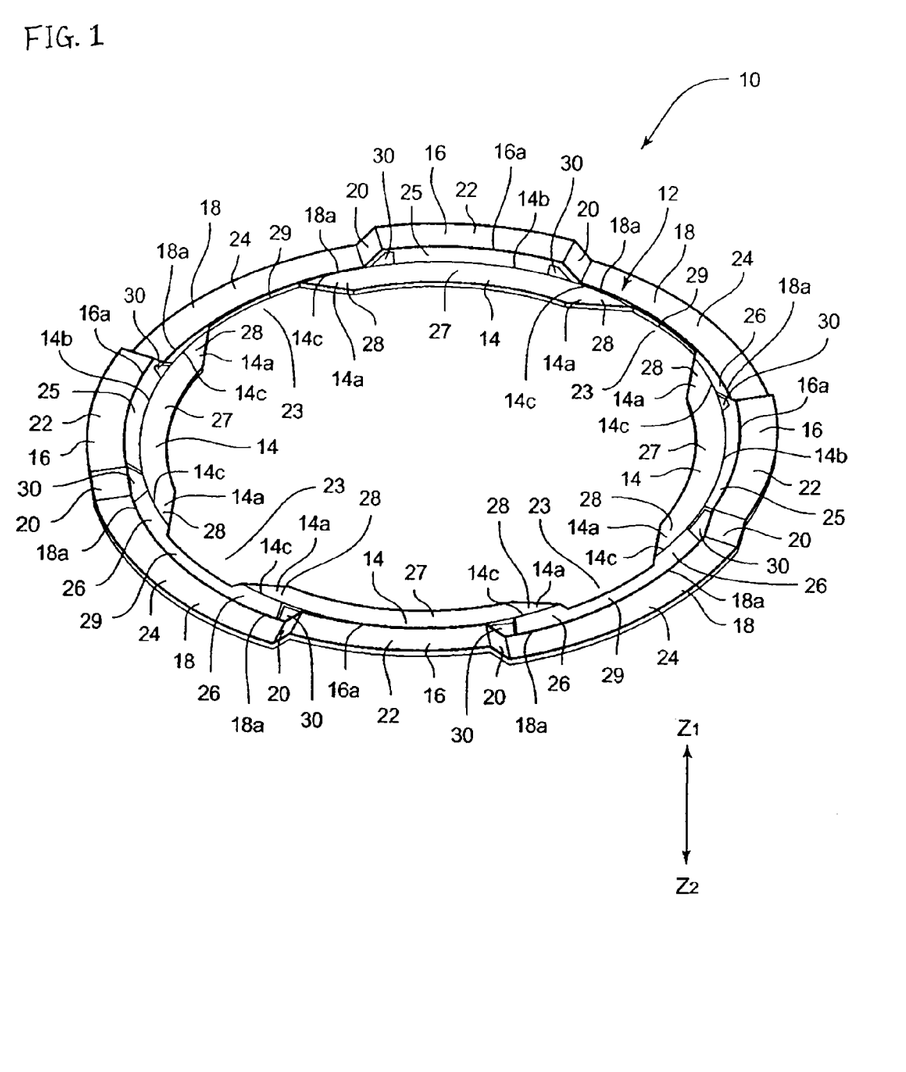
FIG. 1 is a perspective view of a wafer storage container according to an embodiment of the present invention.
Figure 2:
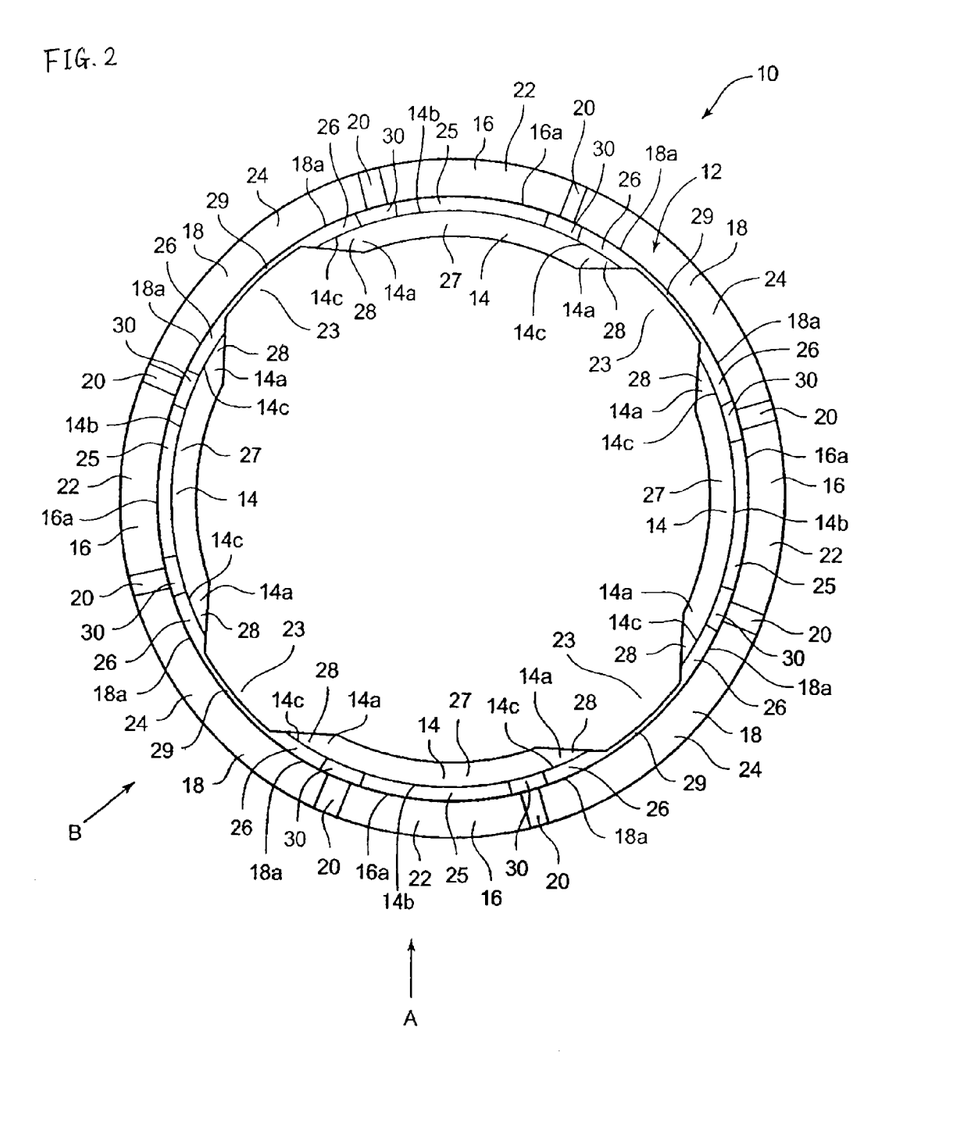
FIG. 2 is a plan view of the wafer storage container according to the embodiment of the present invention.
Figure 3:
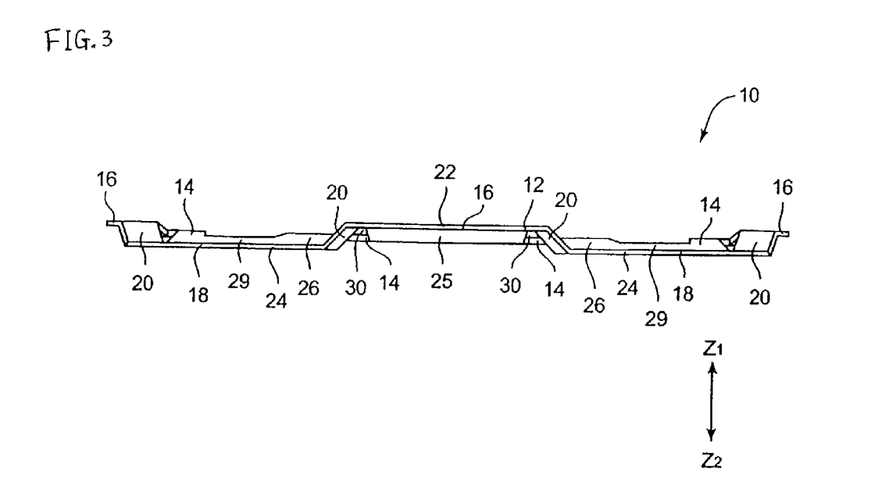
FIG. 3 is a front view of the wafer storage container in FIG. 2 when viewed from a direction indicated by an arrow A.
Figure 4:
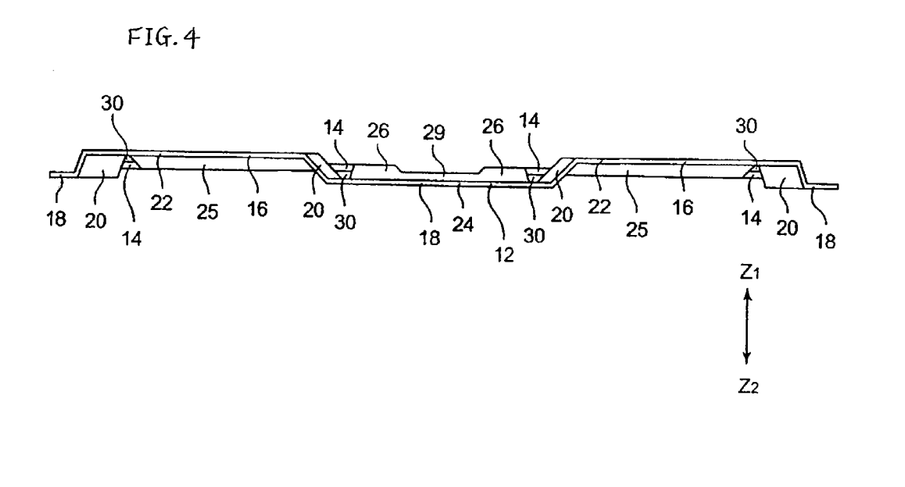
FIG. 4 is a front view of the wafer storage container in FIG. 2 when viewed from a direction indicated by an arrow B.

FIG. 1 is a perspective view of a wafer storage container 10. FIG. 2 is a plan view of the wafer storage container 10. FIG. 3 is a front view of the wafer storage container 10 in FIG. 2 when viewed from a direction indicated by an arrow A. FIG. 4 is a front view of the wafer storage container 10 in FIG. 2 when viewed from a direction indicated by an arrow B. In the following explanation, a direction indicated by an arrow Z1 and a direction indicated by an arrow Z2 shown in FIGS. 1, 3, 4, 6 to 8 are defined as an upward direction and a downward direction, respectively.

As shown in FIGS. 1 and 2, the wafer storage container 10 has a nearly ring-like shape on a plane. The wafer storage container 10 has a ring-like circumferential portion 12 arranged on the outer peripheral edge side of the wafer storage container 10 and a placing portion 14 arranged inside the circumferential portion 12. Examples of material of the wafer storage container 10 include an engineering plastic such as a polyphenylene sulfide (PPS) resin, a polycarbonate (PC) resin, a polybutylene telephthalate (PBT) resin, a polyether ether ketone (PEEK) resin, a polyether sulfone (PES) resin, or a polyether imide (PEI) resin. However, the material is not limited to these materials. Glass fiber may be added to these resins, and conductivity given by carbon fiber, a conductive resin, or the like may be added to these resins. For example, when an outer diameter of a wafer is set at 450 mm, an outside dimension of the wafer storage container 10 in a radial direction preferably falls within the range of 500 to 550 mm. The outside dimension can be appropriately changed in accordance with the outer diameter of a wafer placed on the wafer storage container 10. The wafer storage container 10 is preferably manufactured by injection molding. However, the method is not limited to the injection molding.

In the circumferential portion 12, a ring-like flat plate has such a shape that recessions and projections are alternately repeated every four times along the circumferential direction. More specifically, the circumferential portion 12 connects nearly arc-like projecting portions 22 projecting upward to each other, and is constituted by a lower plate portion 18 located on the lower side of the projecting portion 22. Both the circumferential ends of the projecting portion 22 serve as taper portions 20 connected to the lower plate portion 18. A flat plate-like portion except for the taper portions 20 located on both the ends of the lower plate portion 18 are called upper plate portions 16 and called a recessed portion 24 when the lower plate portion 18 and the taper portions 20 located on both the ends of the lower plate portion 18 are indicated at once. The radial length of the circumferential portion 12 preferably falls within the range of 20 to 30 mm. However, the radial length is not limited to the range.

As shown in FIGS. 3 and 4, the placing portion 14 is arranged between a position of the upper plate portion 16 in a direction of height and a position of the lower plate portion 18 in a direction of height. As shown in FIGS. 1 and 2, the placing portion 14 is mainly arranged inside the projecting portion 22 in the radial direction. End portions 14a on both the ends of the placing portion 14 reaches recessed portions 24 adjacent to both the sides of the projecting portion 22. The placing portion 14 has a nearly arc-like shape when viewed from the above. The placing portion 14 is provided inside each of the projecting portions 22, and a notch groove 23 notched in a nearly arc-like shape is formed between the placing portions 14 adjacent to each other in the circumferential direction. A tapered upper inclined portion 25 which connects the placing portion 14 to the upper plate portion 16 is provided between an outer peripheral portion 14b at the center of the placing portion 14 and an inner peripheral portion 16a of the upper plate portion 16. As described above, since the placing portion 14 is provided between a position of the upper plate portion 16 in a direction of height and a position of the lower plate portion 18 in a direction of height, the upper inclined portion 25 is inclined obliquely upward from the outer peripheral portion 14b to the inner peripheral portion 16a. Tapered lower inclined portions 26 which connect the placing portion 14 to the lower plate portion 18 are provided between outer peripheral portions 14c at the end portions 14a of the placing portion 14 and inner peripheral portions 18a of the lower plate portion 18 located both the sides of the projecting portion 22. The lower inclined portions 26 are inclined obliquely downward from the outer peripheral portions 14c to the inner peripheral portions 18a. A portion corresponding to an inner side of the upper inclined portion 25 at the placing portion 14 is called a lower placing portion 27, and a portion corresponding to an inner side of the lower inclined portion 26 at the placing portion 14 is called an upper placing portion 28.

In the wafer storage container 10, a taper-like extend portion 29 extends obliquely upward from the inner periphery of the lower plate portion 18 to the center of the wafer storage container 10 in a section in which the notch grooves 23 are provided. A through hole 30 which penetrates the wafer storage container 10 is formed in a portion between the taper portion 20 and the placing portion 14 and a portion between the upper inclined portion 25 and the lower inclined portion 26. The thicknesses of the upper plate portion 16, the lower plate portion 18, the taper portion 20, the upper inclined portion 25, the lower inclined portion 26, and the extend portion 29 are preferably 2 to 4 mm. However, these thicknesses are not limited to the above-mentioned ones.

Figure 5:
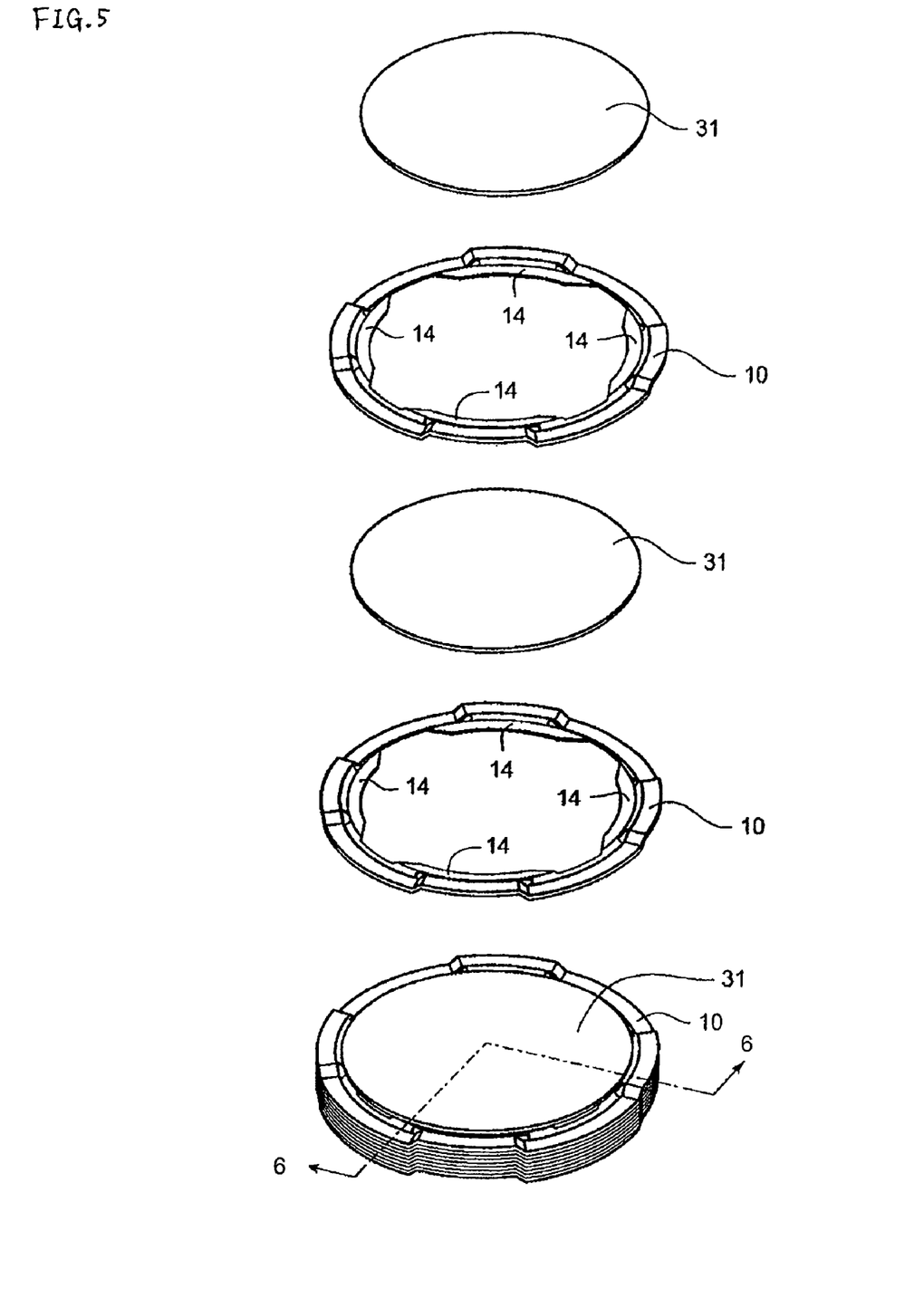
FIG. 5 is a diagram for explaining the steps of storing wafers in the wafer storage containers according to the embodiment of the present invention and stacking the wafer storage containers vertically.

FIG. 5 is a diagram for explaining the steps of storing wafers 31 in the wafer storage containers 10 and vertically stacking the wafer storage containers 10.

As shown in FIG. 5, the wafer 31 is placed on the placing portion 14 of the wafer storage container 10. The wafer 31 has a disk-like shape having a diameter of about 300 to 450 mm. A plurality of wafer storage containers 10 in which the wafers 31 are stored, respectively, are stacked and used in a carrying state or a storing state. A wafer storage container 10 is stacked on another wafer storage container 10 such that the projecting portions 22 are aligned by the taper portions 20 provided at both the ends of each of the projecting portions 22 and the recessed portions 24 are aligned by the taper portions 20 provided at both the ends of each of the recessed portions 24. When the wafer storage containers 10 are stacked, the projecting portions 22 and the recessed portions 24 of the wafer storage container 10 are aligned to each other, respectively. For this reason, the wafer storage containers 10 are not misaligned or unstabled.

Figure 6:
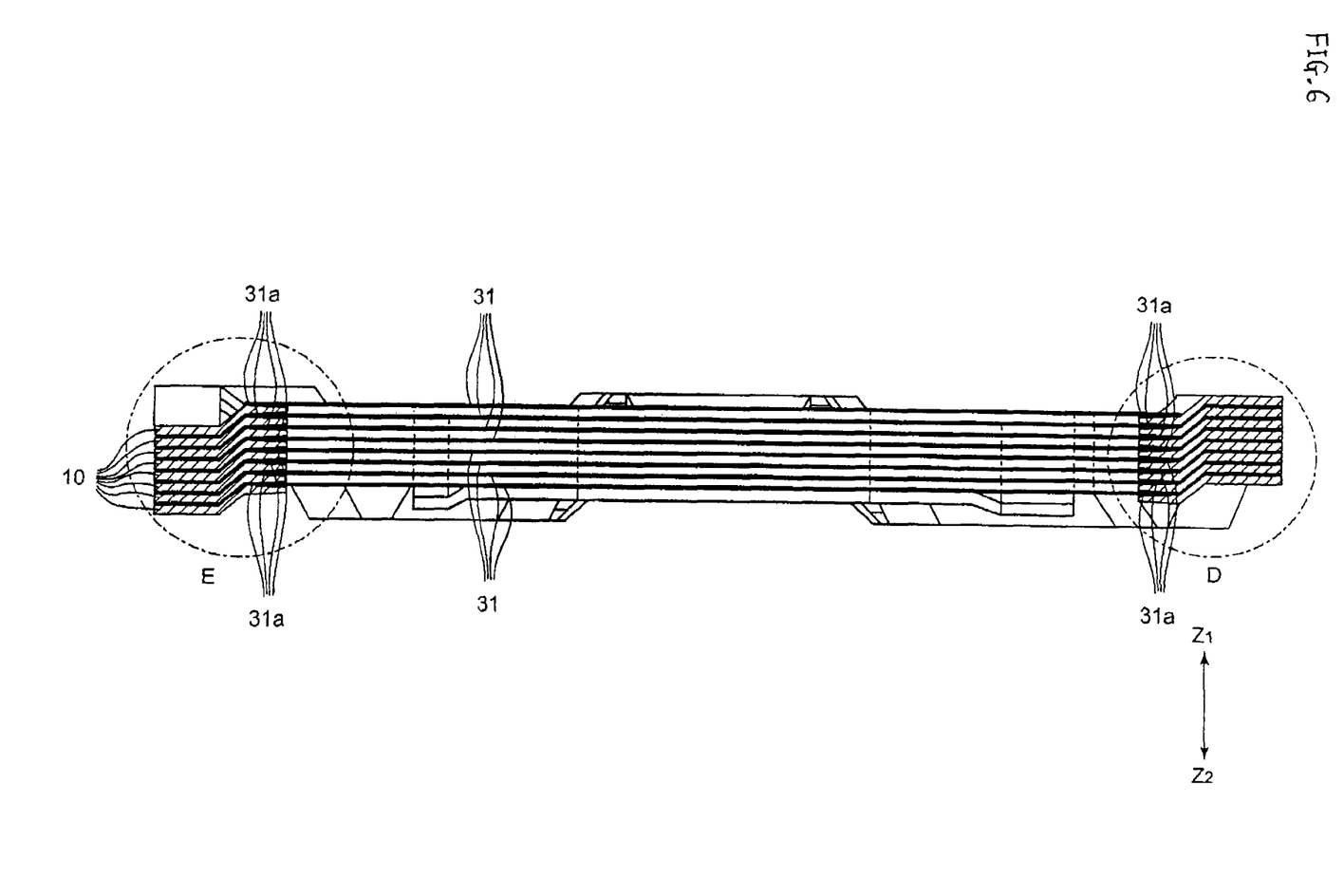
FIG. 6 is a sectional view cut along a 6-6 line in FIG. 5.
Figure 7A:
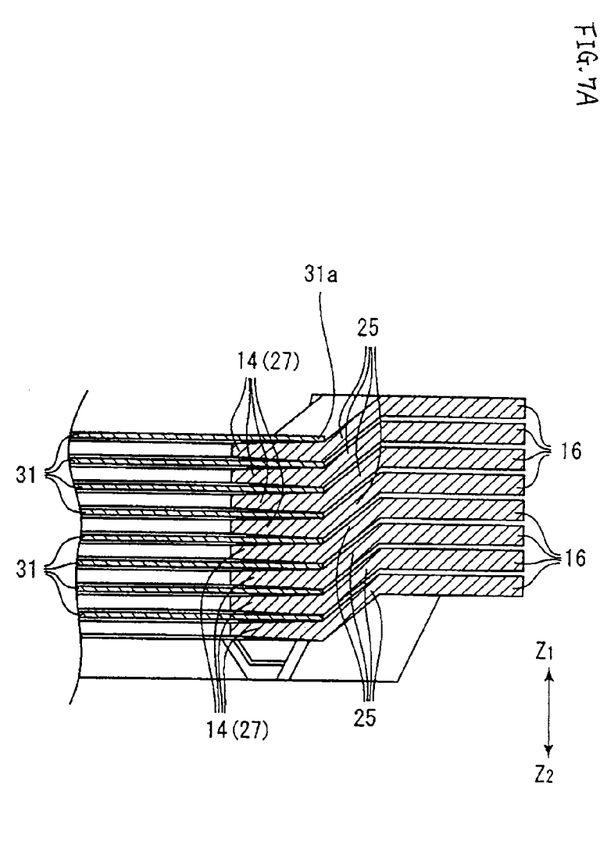
FIG. 7A is an enlarged view of a part D surrounded by an alternate long and short dash line in FIG. 6
Figure 7B:
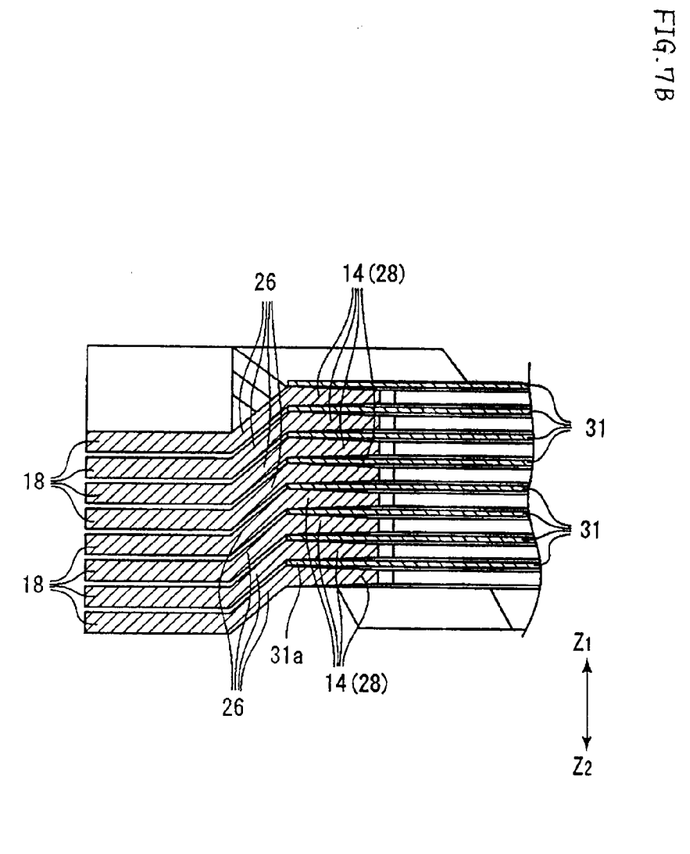
FIG. 7B is an enlarged view of a part E surrounded by an alternate long and short dash line in FIG. 6.
Figure 8A:
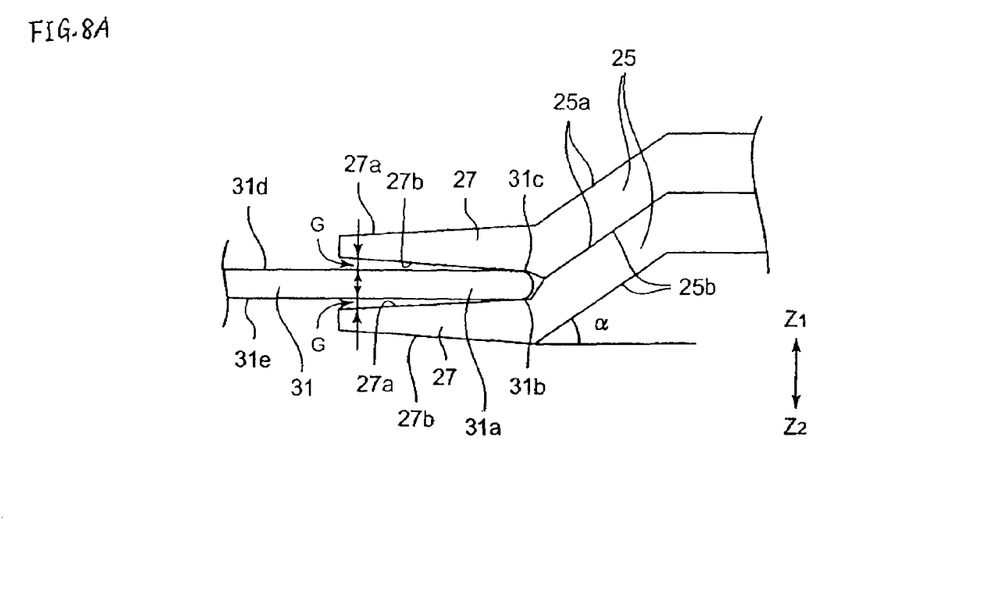
FIG. 8A is a view for explaining a state of a wafer placed on a lower placing portion.
Figure 8B:
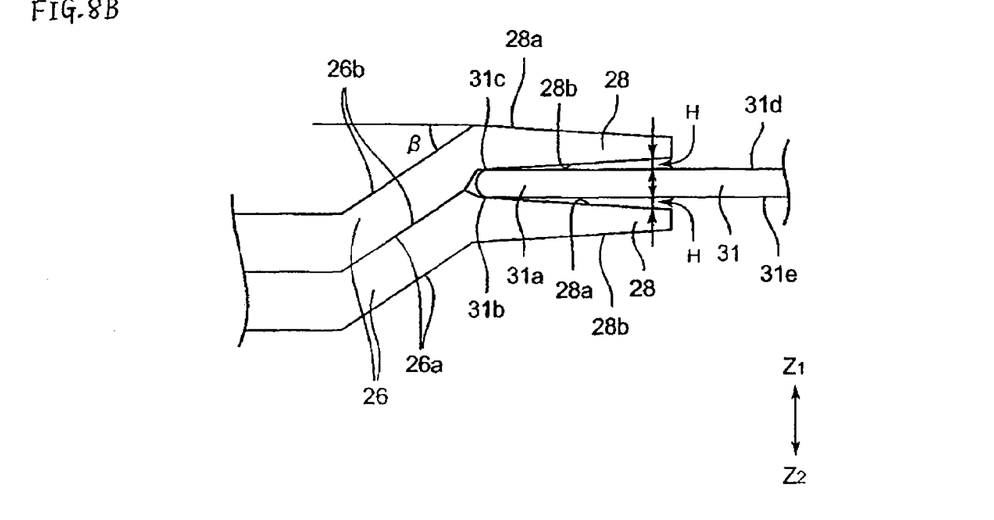
FIG. 8B is a view for explaining a state of a wafer placed on an upper placing portion.

FIG. 6 is a sectional view cut along a 6-6 line in FIG. 5. FIGS. 7A and 7B are enlarged views of parts of the sectional view in FIG. 6, in which FIG. 7A is an enlarged view of a part D surrounded by an alternate long and short dash line in FIG. 6 and FIG. 7B is an enlarged view of a part E surrounded by an alternate long and short dash line in FIG. 6. FIGS. 8A and 8B are views for explaining a state of wafers 31 in a state in which wafer storage containers 10 in which wafers 31 are stored are stacked, in which FIG. 8A is a view for explaining a state of the wafer 31 placed on a lower placing portion 27, and FIG. 8B is a view for explaining a state of the wafer 31 placed on the upper placing portion 28.

As shown in FIGS. 6, 7A, and 7B, when a plurality of wafer storage containers 10 in which the wafers 31 are stored are stacked, an outer peripheral portion 31a of the wafer 31 is held between the placing portions 14. As shown in FIGS. 7A and 7B, a sectional shape of the placing portion 14 has a shape which is gradually tapered from the outside to the inside on the wafer storage container 10.

As shown in FIG. 7A, a portion of the wafer 31 placed on the lower placing portion 27 is held between the lower placing portion 27 of a given wafer storage container 10 in which the wafer 31 is stored and the lower placing portion 27 of a wafer storage container 10 stacked on the upper side of the given wafer storage container 10. As described above, the section of the placing portion 14 has a shape which is gradually tapered from the outside to the inside. For this reason, as shown in FIG. 8A, the lower placing portion 27 has a first inclined surface 27a which is an upper surface and which is inclined downward toward the inside of the wafer 31 in the radial direction and a second inclined surface 27b which is a lower surface and which is inclined upward toward the inside of the wafer 31 in the radial direction. On the other hand, the sectional shape of the outer periphery of the wafer 31 is a nearly arc-like shape. Therefore, when the wafer 31 is held between the lower placing portions 27, only a lower contact portion 31b of the outer peripheral portion 31a of the wafer 31 is in contact with the first inclined surface 27a of the lower placing portion 27 of the wafer storage container 10 in which the wafer 31 is stored. Only an upper contact portion 31c of the outer peripheral portion 31a of the wafer 31 is in contact with the second inclined surface 27b of the lower placing portion 27 of the wafer storage container 10 stacked on the lower wafer storage container 10. More specifically, a gap G is formed between the wafer 31 and the lower placing portion 27. Therefore, an upper surface 31d and a lower surface 31e of the wafer 31 are not in area contact with the lower placing portion 27. When a plurality of wafer storage containers 10 in which the wafers 31 are stored are stacked, the wafer 31 are pressured downward by the weight of the stacked wafer storage containers 10. However, the wafers 31 are in line contact with the first inclined surface 27a and the second inclined surface 27b at the contact portion 31b and the upper contact portion 31c. As a result, the wafer 31 is not unstabled with respect to the wafer storage container 10. An angle α of the upper inclined portion 25 with respect to an extending direction of the lower placing portion 27 preferably falls within the range of 35° to 55°. However, the angle α can be appropriately changed depending on the outer dimensions of the wafer storage container 10. More specifically, as shown in FIG. 8A, when the wafer storage containers 10 are stacked, an outside surface 25b of the upper inclined portion 25 on the upper stacked wafer storage container 10 is in tight contact with an inside surface 25a of the upper inclined portion 25 of the lower wafer storage container 10. For this reason, the wafer storage containers 10 can be prevented from being unstabled.

On the other hand, as shown in FIG. 7B, a portion of the wafer 31 placed on the upper placing portion 28 is held between the upper placing portion 28 of a given wafer storage container 10 in which the wafer 31 is stored and the upper placing portion 28 of a wafer storage container 10 stacked on the upper side of the given wafer storage container 10. As shown in FIG. 8B, the upper placing portion 28 has a first inclined surface 28a which is the upper surface of the upper placing portion 28 and which is inclined downward toward the inside of the wafer 31 in the radial direction and a second inclined surface 28b which is the lower surface of the upper placing portion 28 and which is inclined upward toward the inside of the wafer 31 in the radial direction. On the other hand, the sectional shape of the outer periphery of the wafer 31 is a nearly arc-like shape. Therefore, when the wafer 31 is held between the upper placing portions 28, only the lower contact portion 31b of the outer peripheral portion 31a of the wafer 31 is in contact with the first inclined surface 28a of the upper placing portion 28 of a given wafer storage container 10 in which the wafer is stored. Only the upper contact portion 31c of the outer peripheral portion 31a of the wafer 31 is in contact with the second inclined surface 28b of the upper placing portion 28 of the wafer storage container 10 stacked on the upper side of the given wafer storage container 10. More specifically, a gap H is formed between the wafer 31 and the upper placing portion 28. Therefore, the upper surface 31d and the lower surface 31e of the wafer 31 are not in area contact with the upper placing portion 28. When the plurality of wafer storage containers 10 in which the wafers 31 are stored are stacked, the wafers 31 are pressured downward by the weight of the stacked wafer storage containers 10. However, the wafers 31 are in line contact with the first inclined surface 28a and the second inclined surface 28b at the contact portion 31b and the upper contact portion 31c. As a result, the wafer 31 is not unstabled with respect to the wafer storage container 10. An angle β of the lower inclined portion 26 with respect to an extending direction of the upper placing portion 28 preferably falls within the range of 35° to 55°. However, the angle β can be appropriately changed depending on the outer dimensions of the wafer storage container 10. More specifically, as shown in FIG. 8B, when the wafer storage containers 10 are stacked, an outside surface 26b of the lower inclined portion 26 on the upper stacked wafer storage container 10 is in tight contact with an inside surface 26a of the lower inclined portion 26 of the lower wafer storage container 10. For this reason, the wafer storage containers 10 can be prevented from being unstabled.

Figure 9A:
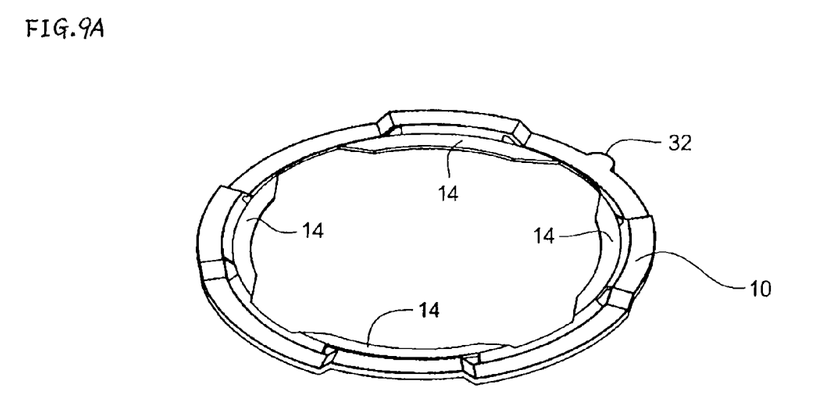
FIG. 9A is a perspective view showing a configuration in which a tab is provided on the wafer storage container.
Figure 9B:
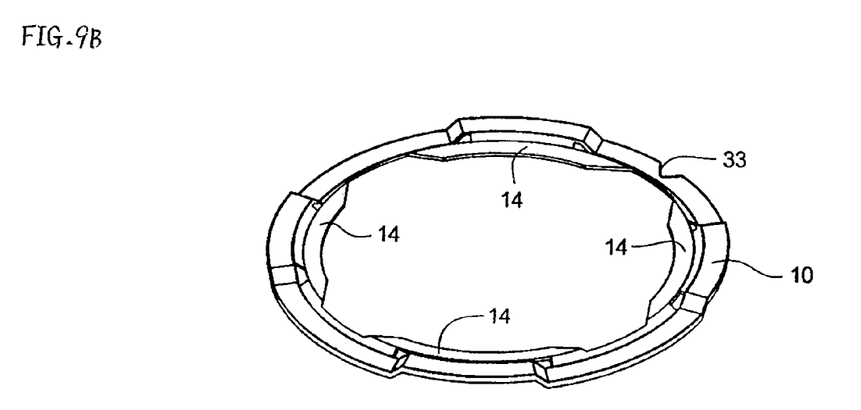
FIG. 9B is a perspective view showing a configuration in which a notch is provided in the wafer storage container.

FIGS. 9A and 9B are perspective views showing a configuration of the wafer storage container 10, in which FIG. 9A is a perspective view showing a configuration in which a tab 32 is provided on the wafer storage container 10, and FIG. 9B is a perspective view showing a configuration in which a notch 33 is provided in the wafer storage container 10.

In the wafer 31, a notch or an orientation flat to indicate an orientation of crystal of the wafer 31 is provided in general. For this reason, as shown in FIGS. 9A and 9B, the tab 32, the notch 33, or a through hole (not shown) serving as an index to place the wafer 31 with a constant orientation can be provided in the surface of the upper plate portion 16 of the wafer storage container 10. When an IC chip in which information of the wafer 31 is stored is built in the wafer storage container 10, and a bar code on which information of the wafer 31 is described is printed on the surface of the wafer storage container 10, so that the information of the wafer 31 stored in the wafer storage container 10 may be read from the wafer storage container 10.

Figure 10A:
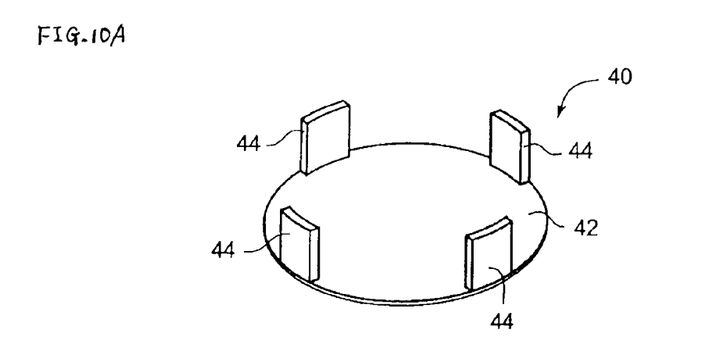
FIG. 10A is a perspective view showing a configuration of a jig used when a wafer is removed from the wafer storage container.
Figure 10B:
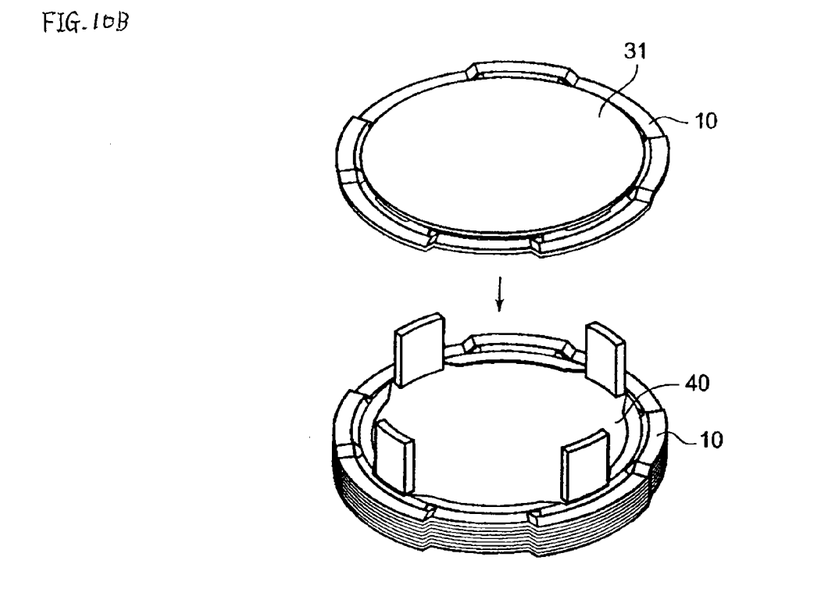
FIG. 10B is a view for explaining a step of extracting a wafer from a wafer storage container.
Figure 10C:
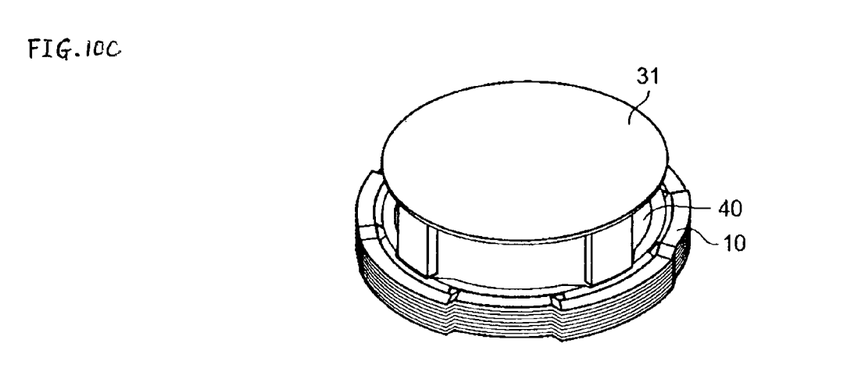
FIG. 10C is a view showing a state in which a wafer is extracted from the wafer storage container by the jig.

FIGS. 10A to 10C are views for explaining a method of extracting the wafer 31 from the wafer storage container 10, in which FIG. 10A is a perspective view showing a configuration of a jig 40 used when the wafer 31 is removed from the wafer storage container 10, FIG. 10B is a view for explaining a step of extracting a wafer 31 from a wafer storage container 10, and FIG. 10C is a view showing a state in which the wafer 31 is extracted from the wafer storage container 10 by the jig 40.

After the stacked wafer storage containers 10 are stored in a case for transportation, the case is transported to a destination. When the wafer storage container 10 is transported to the destination, the wafer 31 is removed from the wafer storage container 10. In general, a machine, a jig, or the like is used in order to remove the wafer 31 from the wafer storage container 10. In the embodiment, when the wafer 31 is removed, the jig 40 shown in FIG. 10A is used. As shown in FIG. 10A, the jig 40 has a disk-like bottom portion 42 and four projecting portions 44 extending from the outer peripheral edge of the bottom portion 42 upward. The four projecting portions 44 are provided on the outer peripheral edge of the bottom portion 42 in a circumferential direction at 90° intervals. A sectional shape obtained by horizontally cutting the projecting portion 44 is a nearly arc-like shape. The projecting portions 44 are provided corresponding to the positions and shapes of the notch grooves 23 formed in the wafer storage container 10. The jig 40 may be set down on the ground or a base, or the jig 40 may be fixed on a device such as a robot arm.

The wafer storage containers 10 are removed from the stacked wafer storage container 10 one by one, and a wafer 31 is extracted from the wafer storage container 10. As shown in FIG. 10B, the extracted wafer storage container 10 is arranged above the jig 40 fixed to a predetermined position (arranging step). At this time, the jig 40 is arranged such that the position of the notch grooves 23 provided in the wafer storage container 10 correspond to the positions of the projecting portions 44. The wafer storage container 10 in which the wafer 31 is stored is moved downward toward the jig 40. In this case, the projecting portion 44 is inserted into the notch groove 23. The projecting portion 44 inserted into the notch groove 23 is brought into contact with the wafer 31 stored in the wafer storage container 10, only the wafer 31 is left on the upper side of the projecting portion 44, and the wafer storage container 10 drops toward the bottom portion 42 of the jig 40 through the notch groove 23 (dropping step). In this manner, after the wafer 31 is placed on the upper surface of the projecting portion 44 (removed from the wafer storage container 10) (see FIG. 10C), the wafer 31 is moved from the upper side of the projecting portion 44 to a desired position (moving step). When the wafer 31 is placed on the upper surface of the projecting portion 44, the wafer 31 can be easily scooped from beneath by a robot arm or the like. In addition, the robot arm is arranged on the lower side of the outer peripheral portion of the wafer 31 from the outside of the projecting portion 44, and the robot arm is moved upward to make it possible to move the wafer 31 from the upper surface of the projecting portion 44. The above arranging step, the dropping step, and the moving step are preferably performed by a machine such as a robot. However, the means is not limited to the machine, and the steps may be performed by a person. When the arranging step and the dropping step are performed by the robot or the like, the surface of the projecting portion 22 of the wafer storage container 10 is preferably adsorbed by the robot or the like to move the wafer storage container 10. The means is not limited to this method.

When the wafer storage containers 10 constituted as described above are stacked, the contact portion 31b of the wafer 31 is in line contact with both the first inclined surface 27a and the first inclined surface 28a. For this reason, the lower surface 31e of the wafer 31 is not in area contact with the lower placing portion 27 and the upper placing portion 28. Furthermore, the upper contact portion 31c of the wafer 31 is in line contact with both the second inclined surface 27b and the second inclined surface 28b. For this reason, the upper surface 31d of the wafer 31 is not in area contact with the lower placing portion 27 and the upper placing portion 28. More specifically, gaps G are formed between the upper surface 31d of the wafer 31 and the lower placing portion 27 and the upper placing portion 28, respectively, and gaps H are formed between the lower surface 31e and the lower placing portion 27 and the upper placing portion 28, respectively. As a result, the surface of the wafer 31 can be prevented from being scratched.

When the wafer storage containers 10 in which the wafers 31 are stored are stacked, the wafer 31 is held between the placing portions 14 while keeping the gaps G and the gaps H between the wafer 31 and the lower placing portions 27 and between the wafer 31 and the upper placing portions 28, respectively. More specifically, the contact portion 31b and the upper contact portion 31c of the wafer 31 are in line contact with the lower placing portions 27 and the upper placing portions 28. Therefore, when the wafer storage containers 10 are stacked, the wafer 31 can be stably stored inside the wafer storage container 10. An easy operation of sequentially stacking the wafer storage containers 10 in which the wafers 31 are stored is performed to make it possible to store the plurality of wafers 31. For this reason, efficiency of the storing operation can be improved.

The wafer storage container 10 is stacked on another wafer storage container 10 to align the projecting portions 22 and the recessed portions 24 to each other. Therefore, when the wafer storage containers 10 are stacked, the projecting portions 22 of the wafer storage containers 10 are fitted in the recessed portions 24 of the wafer storage containers 10, respectively. Therefore, when the wafer storage containers 10 are stacked, the wafer storage containers 10 can be prevented from being misaligned and unstabled.

The wafer storage container 10 has a ring-like shape having a through hole at the center. For this reason, when the wafer 31 is bent by its weight, the wafer 31 can be prevented from being in contact with the placing portion 14. Furthermore, since the wafer storage container 10 has an opening at the center, the wafer storage container 10 can be reduced by a weight corresponding to the volume of the opening.

The notch grooves 23 are provided in the wafer storage container 10. For this reason, the projecting portions 44 of the jig 40 are inserted into the notch grooves 23 to drop the wafer storage container 10 under the jig 40 through the notch grooves 23, and only the wafer 31 can be left on the projections. As a result, the wafer 31 can be easily removed from the wafer storage container 10.

In the wafer storage container 10, the tab 32, the notch 33, or a through hole (not shown) serving as an index which indicates the orientation of the wafer 31 can be provided. For this reason, an orientation can be given to the wafer storage container 10, or the wafer 31 can be stored in the wafer storage container 10 with a constant orientation. A plurality of tabs 32 and a plurality of notches 33 are provided and used when the wafer storage container 10 is positioned. Therefore, when the wafer 31 is removed from the wafer storage container 10 by a device or the like, an orientation can be easily given to the wafer 31. For this reason, operation efficiency can be improved.

Although an embodiment of the present invention has been described above, the present invention can be variously changed without being limited to the embodiment.

In the embodiment described above, the wafer storage container 10 has a circular ring-like shape having a through hole at the center. However, the wafer storage container 10 is not limited to the shape, and the wafer storage container 10 may not have an opening at the center. The outer shape of the wafer storage container 10 is not limited to a circular ring-like shape, and the wafer storage container 10 may have a ring-like shape having another shape such as a hexagonal shape or an octagonal shape, or an elliptical shape.

In the above embodiment, the four projecting portions 22 and the four recessed portions 24 are provided. However, the numbers of projecting portions 22 and recessed portions 24 are not limited to the numbers. Three or less projecting portions 22 and three or less recessed portions 24 may be provided, or five or more projecting portions 22 and five or more recessed portions 24 may be provided.

In the above embodiment, the jig 40 has the four projecting portions 44 provided thereon. However, the number of projecting portions 44 is not limited to the number, three or less projecting portions 44 may be used, or five or more projecting portions 44 may be used. In this case, the shapes of the notch grooves 23 must be caused to cope with the number of projecting portions 44.

In the above embodiment, the through hole 30 is provided in a portion between the taper portion 20 and the placing portion 14 and a portion between the upper inclined portion 25 and the lower inclined portion 26. However, the through hole 30 may not be provided.

The present invention can be used in an industry which manufactures or uses a storage container to transport a wafer.

The present invention has been described in the context of a number of embodiments and variations thereof. It is, however, appreciated that other expedients known to those skilled in the art may be employed without departing from the spirit of the invention. Therefore, it is intended that the appended claims be interpreted as including the embodiments described herein, the alternatives mentioned above, and all equivalents thereto.

What is claimed is:

1. A wafer storage container comprising:
   an outer peripheral portion located outside an outer peripheral edge of a wafer; and
   a placing portion which extends from a position lower than an uppermost surface of the outer peripheral portion to the inside of the wafer in the radial direction and on which the wafer is placed at a position lower than the uppermost surface of the outer peripheral portion, wherein
   the placing portion has a first inclined surface which descends toward the inside of the wafer in the radial direction and can be brought into contact with only the outer peripheral edge of the wafer when the wafer is placed and a second inclined surface which is on a rear side of the first inclined surface and can be brought into contact with only the outer peripheral edge of a second wafer positioned below the second inclined surface when a plurality of wafer storage containers are stacked, wherein
   the outer peripheral portion has a plurality of projecting portions projecting upward and arranged on an upper surface of the outer peripheral portion at predetermined intervals, and
   the first inclined surface is connected to the wafer from both the projecting portions and a recessed portion between the projecting portions to make it possible to horizontally hold the wafer at the same level when the wafer is placed.

2. The wafer storage container according to claim 1, wherein the wafer storage container has a ring-like shape having a through hole at the center.

3. The wafer storage container according to claim 1, wherein the placing portion has a plurality of notch grooves obtained by notching the placing portion along a circumferential direction.

4. The wafer storage container according to claim 2, wherein the placing portion has a plurality of notch grooves obtained by notching the placing portion along a circumferential direction.

5. The wafer storage container according to claim 1, wherein a mark to indicate an orientation of the wafer is provided on the wafer storage container.

6. The wafer storage container according to claim 2, wherein a mark to indicate an orientation of the wafer is provided on the wafer storage container.

7. The wafer storage container according to claim 3, wherein a mark to indicate an orientation of the wafer is provided on the wafer storage container.

8. The wafer storage container according to claim 4, wherein a mark to indicate an orientation of the wafer is provided on the wafer storage container.

9. The wafer storage container according to claim 1, wherein the second inclined surface ascends toward the inside of the wafer in the radial direction.

* * * * *